United States Patent [19]

Shafer et al.

[11] Patent Number: 4,747,678
[45] Date of Patent: May 31, 1988

[54] OPTICAL RELAY SYSTEM WITH MAGNIFICATION

[75] Inventors: David R. Shafer, Fairfield; Abe Offner, Darien; Rama Singh, Bethel, all of Conn.

[73] Assignee: The Perkin-Elmer Corporation, Norwalk, Conn.

[21] Appl. No.: 942,899

[22] Filed: Dec. 17, 1986

[51] Int. Cl.⁴ .............................................. G02B 17/06
[52] U.S. Cl. ..................................... 350/505; 350/442
[58] Field of Search ...................... 350/442, 505, 620; 355/66

[56] References Cited

U.S. PATENT DOCUMENTS

| | | | |
|---|---|---|---|
| 2,585,009 | 2/1952 | Henroteau | 350/620 |
| 2,664,026 | 12/1953 | Kavanagh | 350/442 |
| 3,748,015 | 7/1973 | Offner | 350/505 |
| 3,827,778 | 8/1974 | Wheeler | 350/442 |
| 4,293,186 | 10/1981 | Offner | 350/505 |
| 4,685,777 | 8/1987 | Hirose | 350/505 |

FOREIGN PATENT DOCUMENTS

| | | | |
|---|---|---|---|
| 116487 | 2/1943 | Australia | 350/442 |
| 553569 | 5/1977 | U.S.S.R. | 350/442 |

Primary Examiner—William H. Punter
Attorney, Agent, or Firm—Thomas P. Murphy; Edwin T. Grimes; Francis L. Masselle

[57] ABSTRACT

There is disclosed a ring field relay optical system incorporating concave spherical mirrors and including magnification achieved, at least partially, by a convex spherical mirror. In further modifications, aberrations introduced by the convex mirror are controlled by lens groups formed from fused silica. The system is usable from the visible through the deep ultraviolet portion of the spectrum.

20 Claims, 3 Drawing Sheets

OPTICAL RELAY SYSTEM WITH MAGNIFICATION

TECHNICAL FIELD

This invention pertains to optical relay systems. More particularly, it relates to such systems which include magnification. They have particular utility in the field of step and scan microlithography projection printing and are optically corrected from the visible through the deep ultraviolet portion of the spectrum.

BACKGROUND ART

This invention is based upon annular ring field relay optical systems, also referred to as "restricted off-axis field" optical systems. Examples of such systems are disclosed in U.S. Pat. Nos. 3,748,015 and 4,293,186 of Offner. The basic concept of such a system is employed in the present invention but with the addition of magnification. Two basic versions are described and claimed. One is a fully catoptric system which is usable where a high degree of image quality is not a factor. The other is a catadioptric system wherein the lenses are of fused silica and thus usable in the ultraviolet.

One version of the catoptric system will be described and two specific examples of a catadioptric system will be given.

DISCLOSURE OF INVENTION

The invention comprises an optical system including three concave spherical mirrors and a convex spherical mirror. Each mirror has its center of curvature on the optical axis of the system. Magnification is achieved at least partially by the convex mirror. The system is so configured as to form an intermediate image between the object and the final image.

BEST MODE FOR CARRYING OUT THE INVENTION

Figure 1:
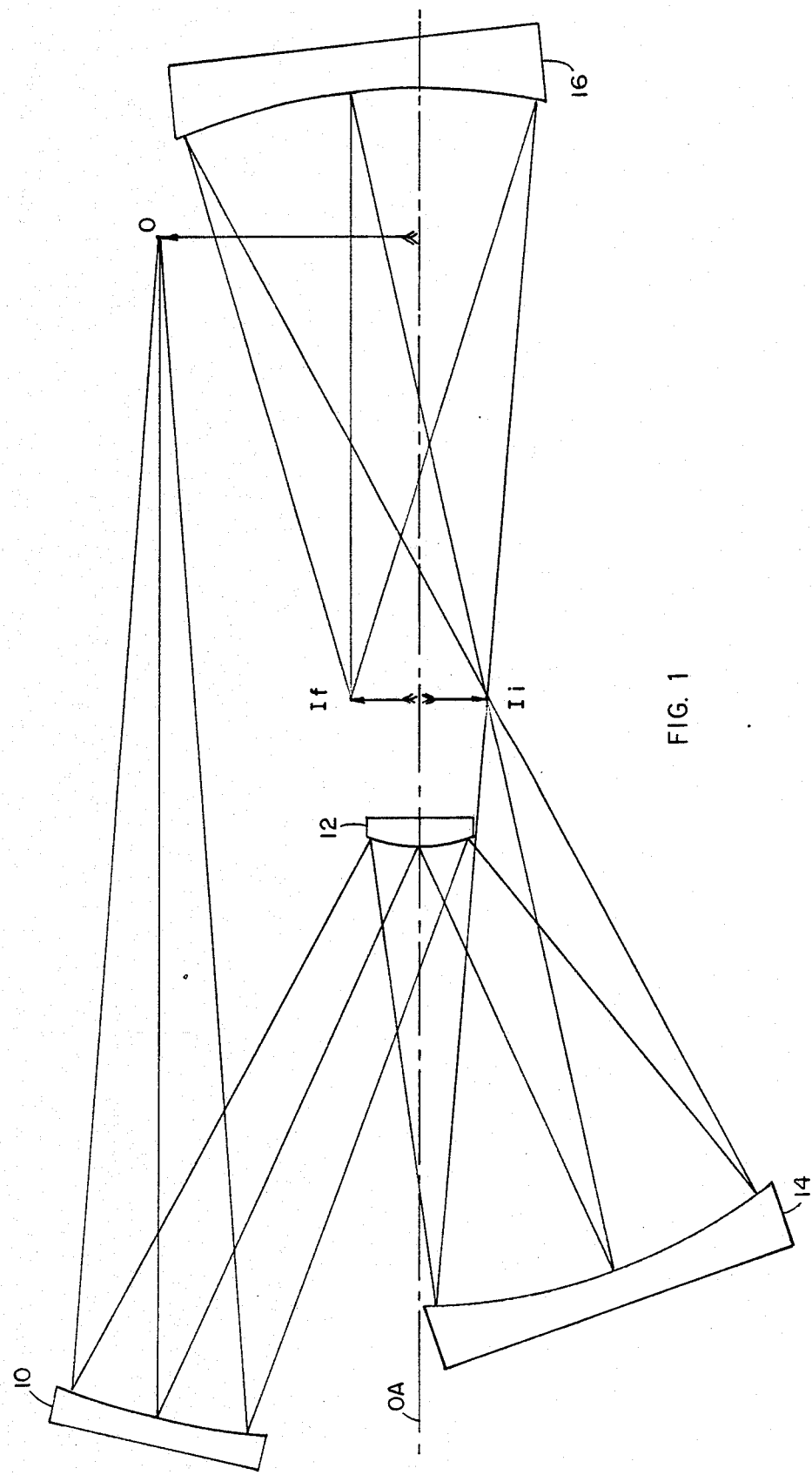
FIG. 1 is a catoptric system in accordance with the invention.

With particular reference to FIG. 1, there is illustrated an optical relay system in accordance with the invention. It comprises a concave spherical mirror 10 positioned to receive light from an object O and reflect it to a convex spherical mirror 12. The object O is in a plane perpendicular to the optical axis at the location of the center of curvature of the mirror 10. Thus, it is imaged at unit magnification. The convex mirror 12 introduces magnification and reflects the light to a second concave spherical mirror 14. Here "magnification", without the modifier "unit", is used to mean imagery in which the size of the image at one conjugate is greater than or less than that at the other conjugate. The mirror 14 forms an intermediate image $I_i$ which is then reflected by concave spherical mirror 16 to a final image $I_f$. All the mirrors, both concave and convex, have their centers of curvature on the optical axis OA.

There are a number of advantages to the optical system of FIG. 1. For example, it is telecentric on both the object and image ends. This is a very desirable feature in that it eliminates changes in the scale of the image for small focus differences. It has a well-defined aperture stop at the convex mirror 12. It has an intermediate image at $I_i$ which allows the system to be baffled well. The mirrors are all spheres and can therefore be made and tested to a very high degree of accuracy. The concave mirrors 10, 14, 16 are working at unit magnification which makes them alignment insensitive, in that no coma is introduced by tilting or decentering them. The convex mirror 12 forms an image of the center of curvature of the preceding concave mirror 10 at the center of curvature of the succeeding concave mirror 14 so that all the concave mirrors are optically concentric. By "optically concentric" it is meant that the centers of curvature are either at the same location, or are optically imaged at that location by an element whose center of curvature is substantiallY distant from that location. This is the case in all three sYstems described herein. Under these conditions, the requirement that the optical system be telecentric on both the object and image sides (i.e., that it be afocal) results in a system with zero Petzval curvature, zero distortion, and zero astigmatism.

The FIG. 1 version is suitable for relaying where a high degree of image quality is not a factor. It might be used, for example, in spectrophotometers, ring field illuminators and relays. However, the convex mirror in each of these systems introduces a substantial amount of coma and some spherical aberration.

Figure 2:
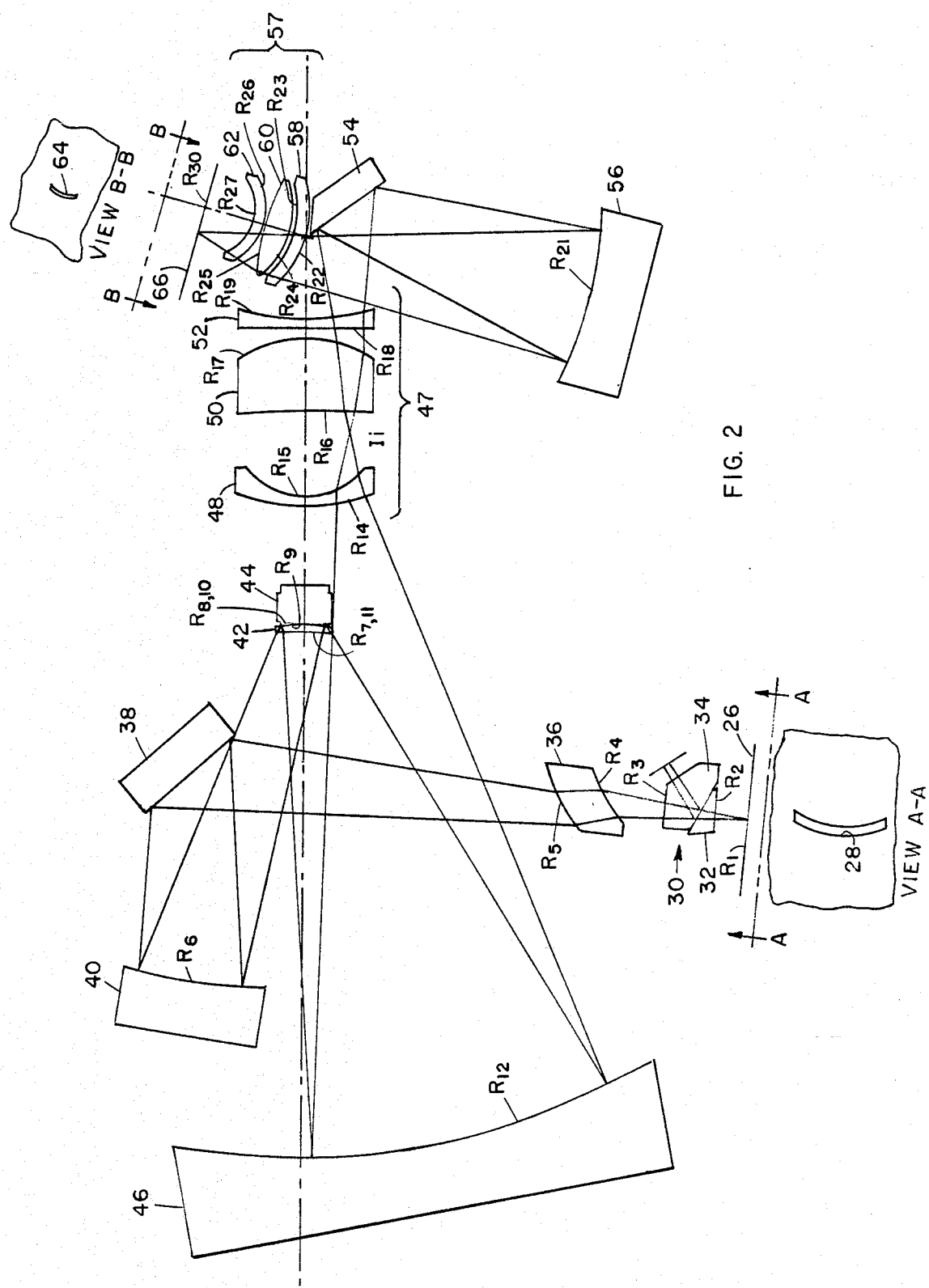
FIG. 2 is a diagram of a catadioptric system in accordance with the invention.
Figure 3:
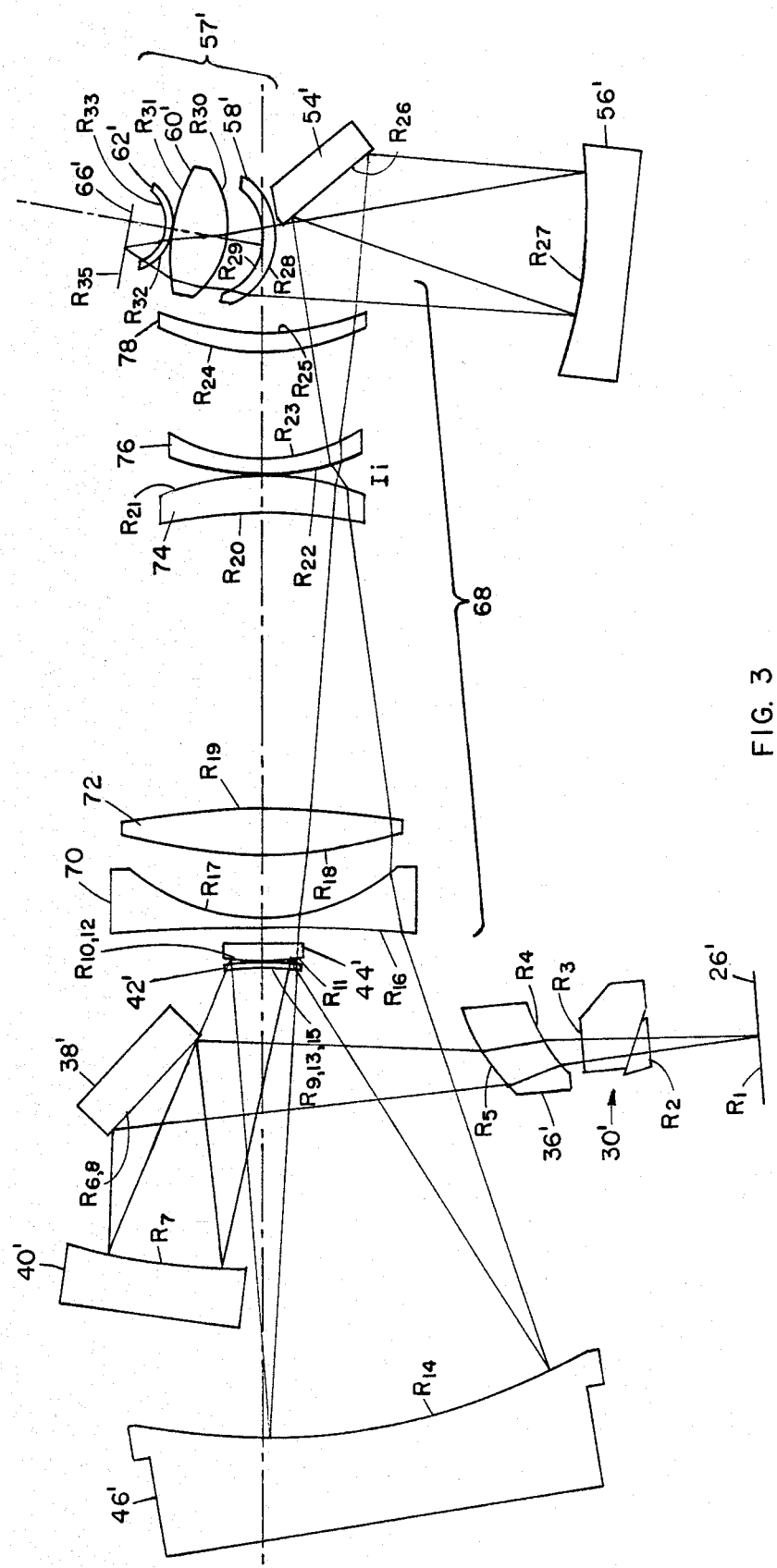
FIG. 3 is a diagram of a modification of the system of FIG. 2.

In order to render the system described above usable in microlithography for imaging a circuit reticle onto a semiconductor wafer with extreme accuracy, the coma and spherical aberration must be substantially eliminated while retaining the advantageous features. The latter include telecentricity and correction of astigmatism, distortion, and Petzval curvature. However, for use in the deep ultraviolet only one glass type, fused silica (quartz), is available. FIG. 2 illustrates a version of a ring field relay system incorporating fused silica lenses which corrects all the third order aberrations, and their chromatic variations, as well as longitudinal and lateral color. This system is designed specifically for use in microlithography with fractional magnification from the object, or mask, plane to the image, or wafer, plane. That is, the object is larger than the image. In the descriptions of FIGS. 2 and 3 which follow, each element is given a conventional reference numeral. In addition, however, the radius of each optical surface is designated by the letter R followed by a subscript numbered sequentially from mask to wafer.

In FIG. 2 a mask plane 26 defines an arcuate object slit 28 from which light passes through a beamsplitter assembly 30 comprising prisms 32, 34. The function of the beamsplitter is to permit initial visual alignment of the mask to the wafer. The illumination then passes through a thick shell 36 which helps to control higher order distortion and astigmatism. The rays are then reflected by a flat mirror 38 onto a concave spherical mask mirror 40. The radiation from mask mirror 40 then passes through a thin shell 42 and impinges upon convex secondary mirror 44 and returns through shell 42.

Radiation from the thin shell 42 is reflected from the concave spherical intermediate mirror 46 through an intermediate lens group 47 comprising a negative lens 48, a positive lens 50, and a negative lens 52. It will be noted that an intermediate image $I_i$ is formed in the space between lens 48 and lens 50. This is an important feature because it allows a field stop (not shown) to be placed in that position to exclude scattered light from the image. It also permits field curvature to be corrected at the intermediate image rather than requiring lenses to be placed near the object or the image.

The radiation from negative lens 52 is redirected by a flat mirror 54 to a concave wafer mirror 56. From the wafer mirror 56 the radiation passes through a final lens group 57 comprising a negative lens 58, a positive lens 60, and a thin shell 62 to an arcuate slit 64 in wafer plane 66.

The primary function of the lens 60 is to correct for the coma introduced by convex mirror 44. The lens accomplishes this result but introduces longitudinal and lateral color, and Petzval curvature. It also bends the chief ray, thereby destroying the telecentricity of one end of the system. The function of lens 48 is to undo these undesirable results produced by the lens 60. The image of lens 60 produced by the mirror 56 falls roughly at the location of lens 48. The power of lens 48 is approximately equal and opposite to that of lens 60. In this manner, both the Petzval curvature and longitudinal and lateral color of the pair can be made zero. Each mirror of the system of FIG. 2 functions very much like the corresponding mirror of the system of FIG. 1, i.e., the concave mirrors 40, 46, and 56 operate at substantially unit magnification, and the convex mirror 44 introduces magnification.

When just lens 48 and lens 60 are present, the chief ray traced from the wafer to the reticle is not corrected for color although the object and image conjugates are color-free. As a result, the chief ray strikes the convex mirror 44 at different heights for different colors. The effect is small but results in an unacceptable amount of chromatic variation in coma and astigmatism. The solution is to correct the color of the chief ray so that all wavelengths hit the convex mirror 44 at the same place. This is achieved by adding the positive lens 50. Its power and shape allow the chromatic variation of astigmatism of the system to be corrected by controlling the color of the chief ray. It also influences various higher order aberrations such as oblique spherical aberrations and higher order coma.

Spherical aberration of the chief ray also causes it to change position at the convex mirror 44 as a function of object height. This causes higher order aberrations. Positive lens 50 affects spherical aberration of the chief ray and thereby influences these higher order aberrations. Thick shell lens 36 and thin shell lens 62 are used to control higher order distortion and astigmatism and have little effect on other aberrations.

With all these lenses present except for thin shell lens 42 it is possible to obtain a design with good monochromatic performance while correcting for chromatic variation of coma, astigmatism, distortion, and Petzval curvature. Spherochromatism, however, cannot be corrected. That is the function of the thin shell lens 42. Once it is in the system, it also has a strong effect on higher order coma (elliptical coma). It also affects chromatic variation of coma.

It is relatively easy to obtain a design with good aberration correction for the tangential and sagittal pupil rays. The 45° orientation rays in the pupil, however, are difficult to control. Successful control of these 45° orientation aberrations results in excellent performance of the FIG. 2 system. This success can be directly traced to three key features.

The first feature is that the height of the chief ray on the wafer mirror 56 is opposite in sign and of similar magnitude as it is at the wafer. This is due to the large deviation from telecentricity introduced by the positive lens 60.

The second, and closely related, feature is that the positive lens 60 has a magnification of about 1.5×. The intermediate image $I_i$ is, therefore, smaller than the final image $I_f$ by approximately the same amount. This improves the clearance situation near the thin shell lens 42 so that faster f number inputs can be used for a given object height without clearance problems. It also means that all the optics prior to the positive lens 60 are working with slower f number beams.

The third feature is the thin shell lens 42. Although its main function is correction of spherochromatism, it also has a large effect on the 45° orientation pupil rays.

The complete optical data for the system of FIG. 2 is given in the following table—all dimensions are in millimeters.

The system operates at ¼× magnification with a numerical aperture of 0.29 at the wafer side image. On the reticle side, the corrected annulus has a mean radius of 80 mm and a width of 5 mm. The spectral range is from 300 nanometers through the visible.

TABLE I

| SURF. | OPTICAL DATA | | |
|---|---|---|---|
| | RADIUS | THICKNESS | GLASS |
| 1 | MASK PLANE | 28.57 | AIR |
| 2 | INF. | 43.001 | FQTZ |
| 3 | INF. | 76.647 | AIR |
| 4 | −135.920 | 40.000 | FQTZ |
| 5 | −151.786 | 476.00 | AIR |
| 6 | −618.359 | −307.131 | −AIR |
| 7 | 130.323 | −4.543 | −FQTZ |
| 8 | 174.501 | −0.100 | −AIR |
| 9 | −156.165 | 0.100 | AIR |
| 10 | 174.501 | 4.543 | FQTZ |
| 11 | 130.323 | 452.023 | AIR |
| 12 | −574.689 | −452.023 | −AIR |
| 13 | INF. | −109.206 | −AIR |
| 14 | −216.561 | −8.050 | −FQTZ |
| 15 | −66.657 | −77.406 | −AIR |
| 16 | 78.638 | −62.000 | −FQTZ |
| 17 | 110.459 | −9.469 | −AIR |
| 18 | INF. | −8.125 | −FQTZ |
| 19 | −229.217 | −69.199 | −AIR |
| 20 | INF. | −250.438 | −AIR |
| 21 | 384.439 | 250.438 | AIR |
| 22 | 104.880 | 7.977 | FQTZ. |
| 23 | 72.520 | 4.999 | AIR |
| 24 | 92.456 | 22.401 | FQTZ |
| 25 | −124.293 | 0.100 | AIR |
| 26 | 45.209 | 9.466 | FQTZ |
| 27 | 40.233 | 29.776 | AIR |
| 28 | INF. | 6.540 | AIR |
| 29 | INF. | −.098 | AIR |
| 30 | WAFER PLANE | — | — |

NOTE:
SURFACES 13, 20, 28, & 29 ARE FICTITIOUS SURFACES AND ARE NOT INDICATED IN FIG. 2.

EXAMPLE

A further example of an optical system in accordance with this invention is illustrated in FIG. 3. This system is very similar to that of FIG. 2. Accordingly, similar elements are given the same reference numerals but with a prime (') attached. Thus, beginning with mask plane 26', the system includes beamsplitter assembly 30', thick shell 36', flat mirror 38', and a concave spherical mask mirror 40'. This system also employs a thin shell 42', adjacent a convex secondary mirror 44', which directs radiation to concave intermediate mirror 46'.

The lenses differ somewhat from those of FIG. 2, but accomplish approximately the same results. They include an intermediate group 68 of five lenses—in order, a planoconcave negative lens 70, a positive lens 72, a positive lens 74, a negative lens 76, and a shell 78. The intermediate image I$_i$ is located between lenses 74 and 76. The beam is then folded by mirror 54' onto concave wafer mirror 56', and from there through a thick shell negative lens 58', positive lens 60', and through thin shell 62' onto wafer plane 66'.

One distinction between the system of FIG. 3 and that of FIG. 2 is that, in the FIG. 3 system, the intermediate image is larger relative to the object than it is in the system of FIG. 2, even though the overall magnification is the same for the two systems. The optical data for the system of FIG. 3 is set forth in Table II below. "The system operates at ¼× magnification with a numerical aperture of 0.35 at the wafer side image. On the reticle side, the corrected annulus has a mean radius of 79 mm and a width of 6 mm. The spectral range is from 240 to 260 nanometers, However, with slight changes in elements 36', 42' and 58' it can be modified to work from 300 nanometers through the visible.

TABLE II

| | OPTICAL DATA | | |
|---|---|---|---|
| SURF. | RADIUS | THICKNESS | MATERIAL |
| 1 | MASK PLANE | 25.4000 | AIR |
| 2 | INF. | 50.8000 | FQTZ |
| 3 | INF. | 45.0593 | AIR |
| 4 | −153.3200 | 49.3477 | FQTZ |
| 5 | −155.6620 | 141.2350 | AIR |
| 6 | INF. | 225.4380 | AIR |
| 7 | −533.3930 | −225.4380 | −AIR |
| 8 | INF. | 1.0000 | −AIR |
| 9 | 114.1130 | −4.4909 | −FQTZ |
| 10 | 157.4720 | −0.0380 | −AIR |
| 11 | −207.9290 | 0.0380 | AIR |
| 12 | 157.4720 | 4.4909 | FQTZ |
| 13 | −114.1130 | 354.5450 | AIR |
| 14 | −506.6530 | −354.5450 | −AIR |
| 15 | 508.0000 | −30.0000 | −AIR |
| 16 | 1922.5400 | −10.0000 | −FQTZ |
| 17 | −160.2210 | −48.4859 | −AIR |
| 18 | −378.2910 | −31.7500 | −FQTZ |
| 19 | 671.9620 | −222.5700 | −AIR |
| 20 | 487.0390 | −28.4100 | −FQTZ |
| 21 | 226.9980 | −2.6591 | −AIR |
| 22 | −250.5630 | −10.1600 | −FQTZ |
| 23 | −134.3760 | −84.2758 | −AIR |
| 24 | −179.3620 | −12.4769 | −FQTZ |
| 25 | −214.7100 | −65.65180 | −AIR |
| 26 | INF. | −241.4450 | AIR |
| 27 | 443.4110 | 231.4450 | AIR |
| 28 | 52.7327 | 10.9510 | FQTZ |
| 29 | 47.7478 | 24.1871 | AIR |
| 30 | 62.6527 | 41.4402 | FQTZ |
| 31 | −136.6080 | 0.0500 | AIR |
| 32 | 40.3715 | 3.3400 | AIR |
| 33 | 35.8549 | 28.4733 | AIR |
| 34 | INF. | −0.0892 | AIR |
| 35 | WAFER PLANE | — | AIR |

NOTE:
SURFACE 34 IS A FICTITIOUS SURFACE

In accordance with the present invention there has been provided a novel application of one-to-one concave spherical mirror relays combined with a magnifying convex mirror. By the further addition of corrective lenses it has become possible to provide a high quality substantially aberration-free image. Additional advantages are achieved by forming an intermediate image within the optical system. This permits aberration corrections at the intermediate image and also allows suitable baffling of the system while providing substantial physical working distances at the object and the image.

It is believed that the many other advantages of this invention will be apparent to those skilled in the art. It will also be apparent that a number of variations and modifications may be made in the present invention without departing from its spirit and scope. Accordingly, the foregoing description is to be construed as illustrative only, rather than limiting. This invention is limited only by the scope of the following claims.

We claim:

1. An optical system for forming a magnified image of an object within an annular ring field concentric with the optical axis of the system, comprising:

first, second, and third concave spherical mirrors, a convex spherical mirror providing substantially all of the magnification in the system, each of said mirrors having its center of curvature on the optical axis of the system, said first concave mirror being disposed to receive light from an object area, said convex mirror being disposed to receive light from said first concave mirror, said second concave mirror being disposed to receive light from said convex mirror, and said third concave mirror being disposed to receive light from said second concave mirror and focus it at a final image area, said second concave mirror focusing light at an intermediate image area between said second and third concave mirrors.

2. The optical system of claim 1 wherein all the concave mirrors operate at unit magnification.

3. The optical system of claim 1 which is substantially telecentric in both the object and image spaces.

4. The optical system of claim 1 further comprising:

a plurality of refractive lens means disposed throughout the optical path of the system for correcting aberrations resulting from the presence of said convex mirror.

5. The optical system of claim 4 wherein said plurality of lens means comprises:

a first lens group positioned between the object and the first concave spherical mirror;

a lens group positioned closely adjacent the convex mirror;

an intermediate lens group positioned between the second concave spherical mirror and the third concave spherical mirror; and a final lens group positioned between the third concave spherical mirror and the final image area.

6. The optical system of claim 5 wherein:

said final lens group comprises at least one lens means for correcting coma introduced by said convex mirror.

7. The optical system of claim 6 wherein:

said intermediate lens group comprises at least one lens means for correcting longitudinal and lateral color introduced by the coma correcting lens means of said final lens group.

8. The optical system of claim 7 wherein:

said intermediate lens group comprises at least one lens means for correcting Petzval curvature.

9. The optical system of claim 7 wherein the powers of:

(a) the lens means contained within the intermediate lens group for correcting longitudinal and lateral color; and (b) the coma correcting lens means of said final lens group are approximately equal and opposite.

10. The optical system of claim 9 wherein:
said intermediate lens group comprises at least one lens means for correcting Petzval curvature.

11. The optical system of claim 7 wherein:
the intermediate image formed in the system is larger than the final image and the coma correcting lens means of the final lens group introduces magnification.

12. The optical system of claim 5 wherein the lens group adjacent the convex mirror comprises a thin shell for correcting spherochromatism.

13. The optical system of claim 5 wherein additional magnification takes place in the final lens group.

14. The optical system of claim 5 wherein all lens means are of the same material.

15. The optical system of claim 14 wherein all lens means are fused silica.

16. The optical system of claim 5 wherein all the concave mirrors operate at substantially unit magnification.

17. The optical system of claim 5 which is substantially telecentric in both the object and image spaces.

18. An optical system according to claim 5 in which the final lens group has a focal length substantially smaller than the distance between this group and the third concave mirror.

19. The optical system of claim 1 wherein said concave mirrors are optically concentric.

20. The optical system of claim 5 wherein said concave mirrors are nearly optically concentric.

* * * * *